United States Patent [19]
Fujisawa et al.

[11] Patent Number: 5,809,556
[45] Date of Patent: Sep. 15, 1998

[54] DATA STORAGE SYSTEM FOR HIGHLY FREQUENT REPETITIVE DATA WRITING

[75] Inventors: Akiko Fujisawa, Machida; Shinya Takahashi, Hino, both of Japan

[73] Assignee: Toshiba Corporation, Japan

[21] Appl. No.: 60,831

[22] Filed: May 14, 1993

[30] Foreign Application Priority Data

May 15, 1992 [JP] Japan .................................. 4-123023

[51] Int. Cl.⁶ .................................................. G06F 12/06
[52] U.S. Cl. ......................................... 711/173; 711/103
[58] Field of Search ..................................... 395/400, 425, 395/430; 360/53; 369/58; 365/185.11, 185.33; 711/103, 5, 173

[56] References Cited

U.S. PATENT DOCUMENTS

| | | | |
|---|---|---|---|
| 4,638,472 | 1/1987 | Ogata et al. | 369/54 |
| 4,706,136 | 11/1987 | Wentzel et al. | 360/39 |
| 4,752,871 | 6/1988 | Sparks et al. | 365/185.11 |
| 4,774,544 | 9/1988 | Tsuchiya et al. | 355/311 |
| 4,774,700 | 9/1988 | Satoh et al. | 369/54 |
| 4,821,254 | 4/1989 | Satoh et al. | 369/54 |
| 4,841,498 | 6/1989 | Sugimura et al. | 369/32 |
| 4,849,956 | 7/1989 | Aizawa | 369/58 |
| 4,885,735 | 12/1989 | Fukushima et al. | 369/59 |
| 4,905,140 | 2/1990 | Sakakibara et al. | 395/430 |
| 4,926,272 | 5/1990 | Takamatsu et al. | 360/49 |
| 5,034,922 | 7/1991 | Burgess | 365/189.07 |
| 5,161,157 | 11/1992 | Owen et al. | 371/10.2 |
| 5,261,110 | 11/1993 | Mitsuishi | 395/800 |
| 5,263,003 | 11/1993 | Cowles et al. | 365/230.03 |
| 5,268,870 | 12/1993 | Harari | 365/218 |
| 5,270,979 | 12/1993 | Harari et al. | 365/218 |
| 5,293,560 | 3/1994 | Harari | 365/185 |
| 5,297,148 | 3/1994 | Harari et al. | 371/10.2 |
| 5,303,198 | 4/1994 | Adachi et al. | 365/218 |
| 5,313,420 | 5/1994 | Masuoka | 365/185.33 |
| 5,321,699 | 6/1994 | Endoh et al. | 376/21.5 |
| 5,321,845 | 6/1994 | Sawase et al. | 395/800 |
| 5,357,462 | 10/1994 | Tanaka et al. | 365/185 |
| 5,379,256 | 1/1995 | Tanaka et al. | 365/185 |
| 5,544,356 | 8/1996 | Robsinson et al. | 395/600 |

FOREIGN PATENT DOCUMENTS

| | | |
|---|---|---|
| 61-35637 | 8/1982 | Japan . |
| 4-8838 | 12/1983 | Japan . |
| 59-162695 | 9/1984 | Japan . |
| 60-47299 | 3/1985 | Japan . |
| 4-35780 | 6/1987 | Japan . |
| 3-167644 | 7/1991 | Japan . |
| WO 89/10618 | 2/1989 | WIPO . |

*Primary Examiner*—Eddie P. Chan
*Assistant Examiner*—Hiep T. Nguyen
*Attorney, Agent, or Firm*—Banner & Witcoff, Ltd.

[57] ABSTRACT

A data storage system has a data storage device comprising an electrically erasable programmable read-only memory which has an array of data storage areas for storing supplied data therein. Supplied data may be written successively in the data storage areas again and again until any one of the data storage areas becomes unusable. Supplied data may also be written repeatedly in each of the data storage areas until each data storage area becomes unusable, and the writing of supplied data may be stopped when all the data storage areas become unusable. Alternatively, supplied data may be written successively in the data storage areas except any one or more of the data storage areas which have become unusable, and the writing of supplied data may be stopped when all the data storage areas become unusable.

15 Claims, 7 Drawing Sheets

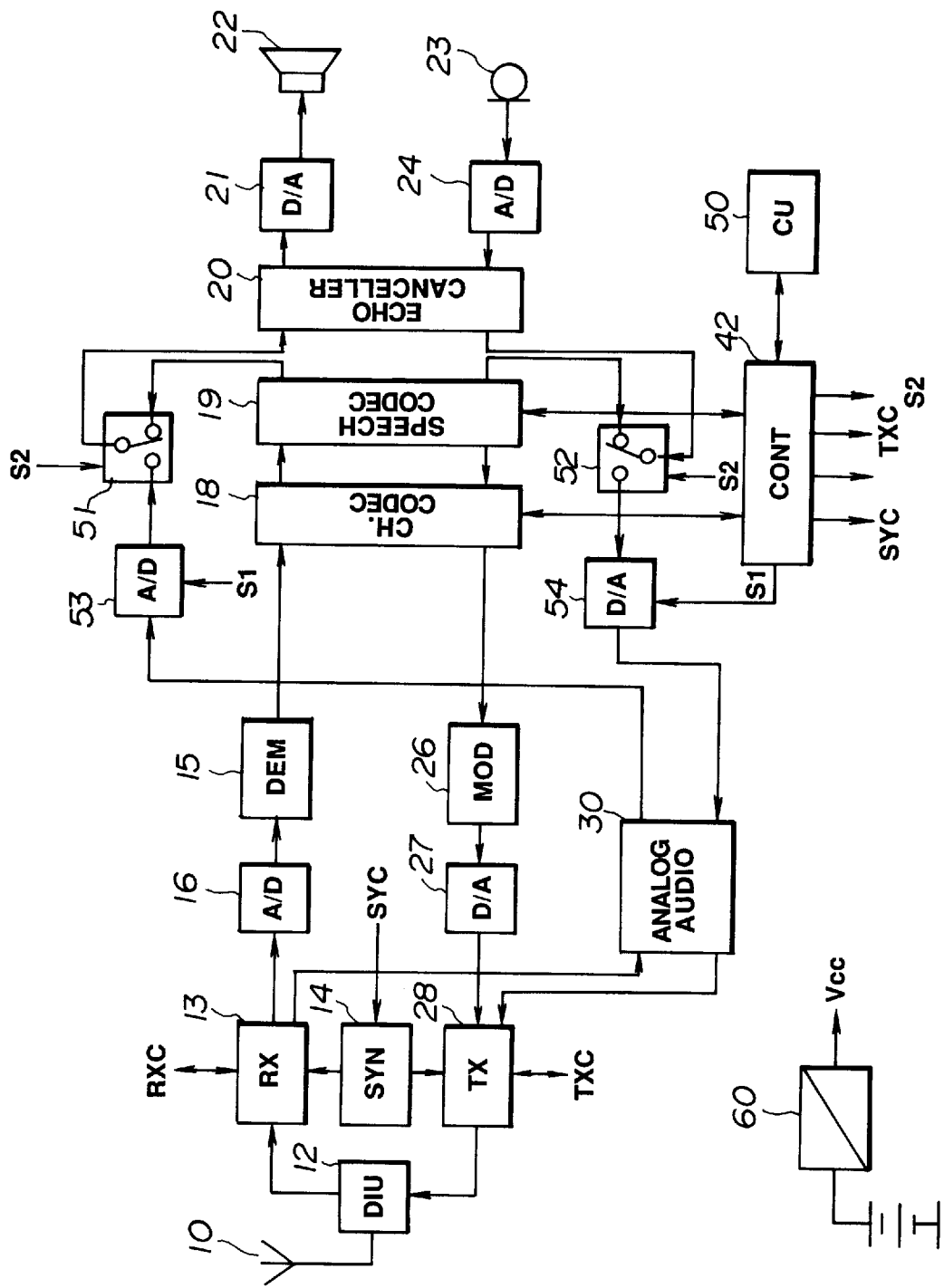

DATA STORAGE SYSTEM FOR HIGHLY FREQUENT REPETITIVE DATA WRITING

BACKGROUND OF THE INVENTION

1. Field of the Invention

The present invention relates to a data storage system, and more particularly to a method of storing data in a data storage device such as an electrically erasable programmable read-only memory ($E^2PROM$).

2. Description of the Relevant Art

Electrically erasable programmable read-only memories ($E^2PROM$) are often finding use as data storage devices in small-size electronic equipment such as a mobile radio telephone set, for example, in a mobile radio communication system. The electrically erasable programmable read-only memories may be used as non-volatile memories in small-size electronic devices because they can store data without any backup power supplies which would otherwise be required by static random-access memories (SRAM).

One problem with the electrically erasable programmable read-only memories is that there is a certain limitation on the number of times that data can repeatedly be written in one data storage location. Typically, data can repeatedly be written in one data storage location up to about 10,000 (ten thousand) times, and can no longer be written in the data storage location beyond that limitation. If an electronic device with such an electrically erasable programmable read-only memory requires data to be written highly frequently in the memory, then the electronic device becomes unusable relatively soon because the limitation on the number of times that data can repeatedly be written is reached quite shortly.

Therefore, the electrically erasable programmable read-only memories cannot be used in electronic devices that demand highly frequent repetitive writing of data.

SUMMARY OF THE INVENTION

It is therefore an object of the present invention to provide a data storage system which is capable of writing data in a data storage device repeatedly an increased number of times.

Another object of the present invention is to provide a method of storing data in a data storage device repeatedly an increased number of times.

According to an aspect of the present invention, there is provided a data storage system comprising a data storage device having an array of data storage areas for storing supplied data therein, first means for writing supplied data successively in the data storage areas, second means for determining whether the data has properly been written in each of the data storage areas, and third means for interrupting writing of supplied data in the data storage device if the data has not properly been written in any of the data storage areas as determined by the second means.

According to another aspect of the present invention, there is provided a data storage system comprising a data storage device having an array of data storage areas for storing supplied data therein, first means for writing supplied data repeatedly in the data storage areas, second means for determining whether the data has properly been written in each of the data storage areas, and third means for controlling the first means to write supplied data repeatedly in the data storage areas except any one or more of the data storage areas in which the data has not properly been written as determined by the second means.

According to still another aspect of the present invention, there is provided a data storage system comprising a data storage device having an array of data storage areas for storing supplied data therein, first means for writing supplied data successively in the data storage areas, second means for determining whether the data has properly been written in each of the data storage areas, and third means for controlling the first means to write supplied data successively in the data storage areas except any one or more of the data storage areas in which the data has not properly been written as determined by the second means.

According to yet another aspect of the present invention, there is provided a data storage system comprising a data storage device having an array of data storage areas for storing supplied data therein, writing means for writing supplied data successively in the data storage areas, and control means for interrupting writing of data in the data storage device if any one of the data storage areas is unusable and controlling the writing means to write supplied data successively in the data storage areas again if all of the data storage areas are usable.

According to yet still another aspect of the present invention, there is provided a data storage system comprising a data storage device having an array of data storage areas for storing supplied data therein, writing means for writing supplied data repeatedly in the data storage areas, and control means for controlling the writing means to write supplied data repeatedly in each of the data storage areas until the each data storage area becomes unusable and controlling the writing means to write supplied data repeatedly in a next one of the data storage areas when the each data storage area becomes unusable.

According to a further aspect of the present invention, there is provided a data storage system comprising a data storage device having an array of data storage areas for storing supplied data therein, writing means for writing supplied data successively in the data storage areas, and control means for controlling the writing means to write supplied data successively in the data storage areas except any one or more of the data storage areas which have become unusable and controlling the writing means to stop writing supplied data when all the data storage areas become unusable.

According to a still further aspect of the present invention, there is provided a method of writing data in a data storage device having an array of data storage areas, comprising the steps of writing supplied data successively in the data storage areas, determining whether the data has properly been written in each of the data storage areas, and interrupting writing of supplied data in the data storage device if the data is determined as having not properly been written in any of the data storage areas.

According to a yet further aspect of the present invention, there is provided a method of writing data in a data storage device having an array of data storage areas, comprising the steps of writing supplied data repeatedly in the data storage areas, determining whether the data has properly been written in each of the data storage areas, and writing supplied data repeatedly in the data storage areas except any one or more of the data storage areas in which the data is determined as having not properly been written.

According to a yet still further aspect of the present invention, there is provided a method of writing data in a data storage device having an array of data storage areas, comprising the steps of writing supplied data successively in the data storage areas, determining whether the data has properly been written in each of the data storage areas, and writing supplied data successively in the data storage areas except any one or more of the data storage areas in which the data is determined as having not properly been written.

According to another aspect of the present invention, there is provided a method of writing data in a data storage device having an array of data storage areas, comprising the steps of writing supplied data successively in the data storage areas, interrupting writing of data in the data storage device if any one of the data storage areas is unusable, and writing supplied data successively in the data storage areas again if all of the data storage areas are usable.

According to still another aspect of the present invention, there is provided a method of writing data in a data storage device having an array of data storage areas, comprising the steps of writing supplied data repeatedly in each of the data storage areas until the each data storage area becomes unusable, and stopping writing supplied data when all the data storage areas become unusable.

According to a further aspect of the present invention, there is provided a method of writing data in a data storage device having an array of data storage areas, comprising the steps of writing supplied data successively in the data storage areas except any one or more of the data storage areas which have become unusable, and stopping writing supplied data when all the data storage areas become unusable.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 8 is a block diagram of a mobile radio telephone set in the dual-mode mobile radio communication system shown in FIG. 7.

DETAILED DESCRIPTION OF THE PREFERRED EMBODIMENTS

Figure 1:
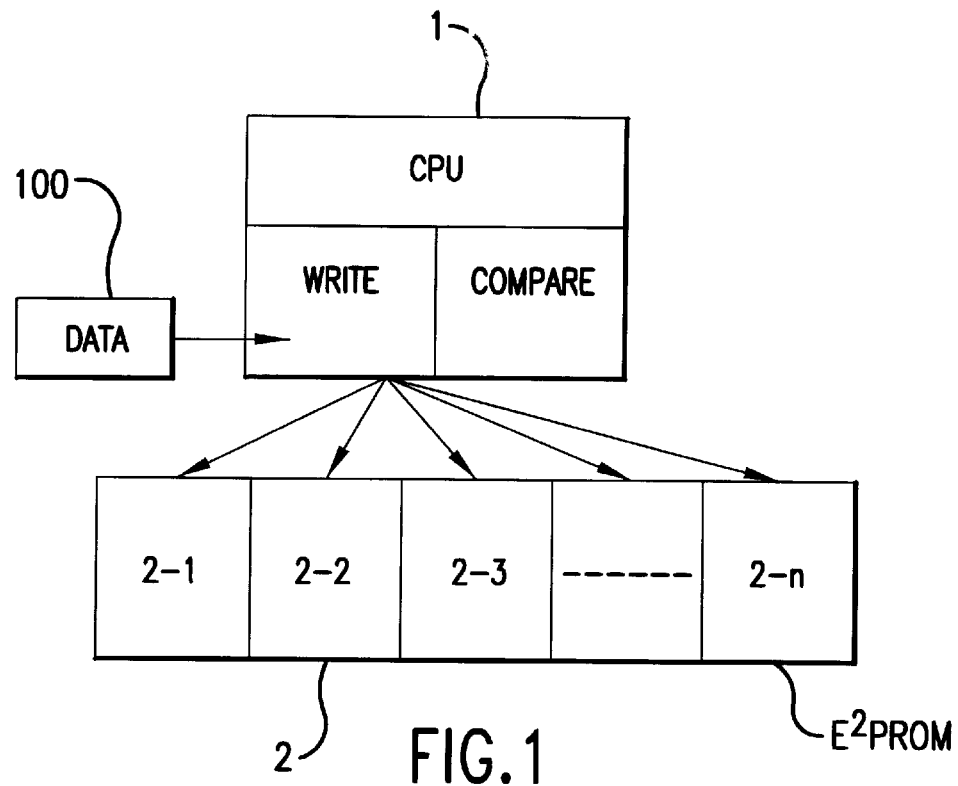
FIG. 1 is a block diagram of a data storage system according to an embodiment of the present invention.

As shown in FIG. 1, a data storage system according to an embodiment of the present invention comprises a central processing unit (CPU) 1 and a data storage device 2 in the form of an electrically erasable programmable read-only memory ($E^2$PROM) which is controllable by the CPU 1 to store and read data. The $E^2$PROM 2 has an array of n divided data storage areas 2-1~2-n each composed of at least a data storage location indicated by an address.

Figure 2:
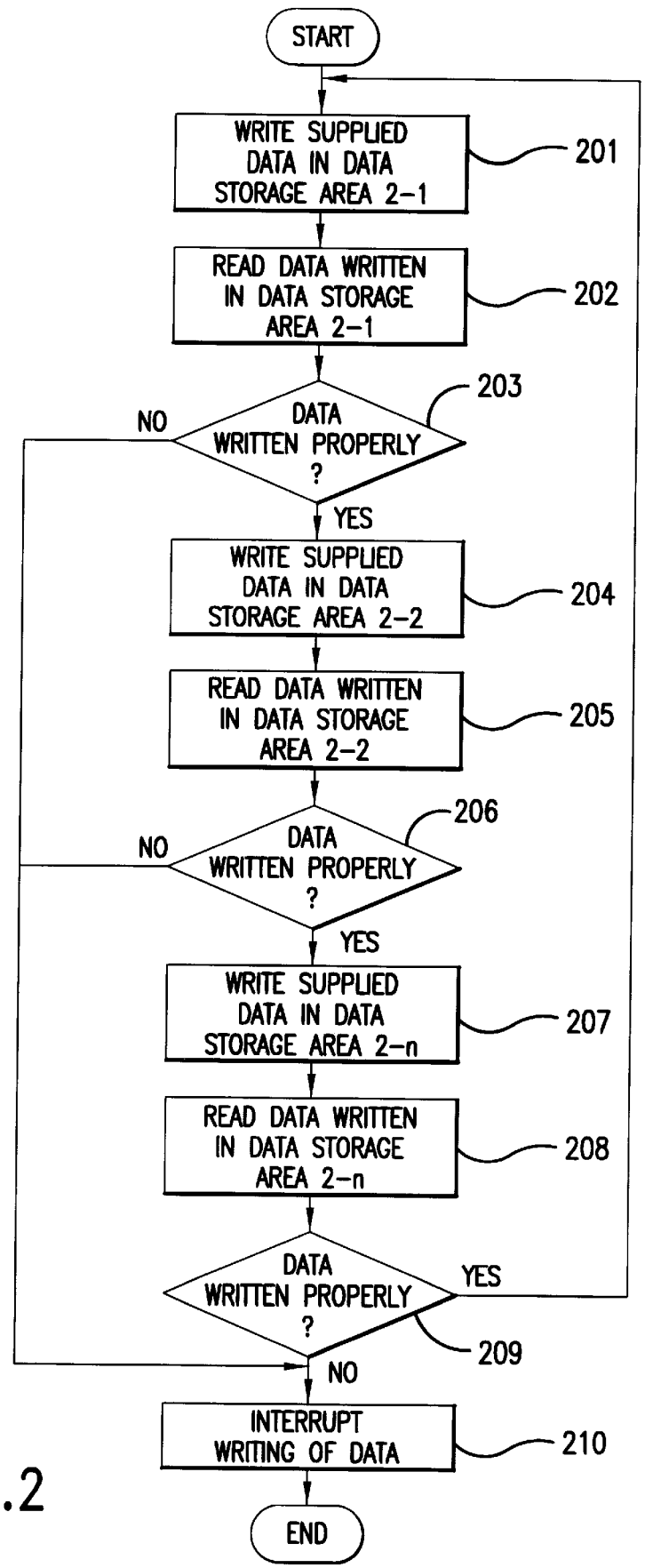
FIG. 2 is a flowchart of a process of writing data in a data storage device of the data storage system shown in FIG. 1.

Operation of the data storage system shown in FIG. 1 will be described below with reference to the flowchart of FIG. 2.

After the data storage system is switched on and starts operating, the CPU 1 writes supplied data 100 in the data storage area 2-1 of the $E^2$PROM 2 in a step 201. Then, the CPU 1 reads a portion or fragment of the data written in the data storage area 2-1 in a step 202, and compares the read data fragment with the supplied data 100, not written in the data storage area 2-1, to determine whether the data has been written properly in the data storage area 2-1 or not in a step 203. If written properly, then control proceeds to a step 204, and if not, then control jumps to a step 210. In the step 204, the CPU 1 writes next supplied data 100 in the data storage area 2-2 of the $E^2$PROM 2. Thereafter, the CPU 1 reads a fragment of the data written in the data storage area 2-2 in a step 205, and compares the read data fragment with the next supplied data 100, not written in the data storage area 2-2, to determine whether the data has been written properly in the data storage area 2-2 or not in a step 206. If written properly, then control proceeds to a next step following the step 206, and if not, then control jumps to the step 210.

The CPU 1 writes successively supplied data in the successive data storage areas 2-3~2-(n−1) of the $E^2$PROM 2 in the same manner as the steps 201 through 204 insofar as the writing of these data is properly carried out. Then, control proceeds to a step 207 in which the CPU 1 writes supplied data 100 in the data storage area 2-n of the $E^2$PROM 2. The step 207 is followed by a step 208 in which the CPU 1 reads a fragment of the data written in the data storage area 2-n. Then, the CPU 207 compares the read data fragment with the supplied data 100, not written in the data storage area 2-n, to determine whether the data has been written properly in the data storage area 2-n or not in a step 209. If written properly, control returns to the step 201 for repetitive writing of data, and if not, control goes to the step 210. In the step 210, the CPU 1 decides that the $E^2$PROM 2 is unusable and interrupts the writing of data into the $E^2$PROM 2. The data writing sequence is now brought to an end.

Since the successively supplied data are written successively in the data storage areas 2-1~2-n of the $E^2$PROM 2, the data is written in each data storage area 1/n times upon data storage in the data storage areas 2-1~2-n in a single writing sequence. Therefore, even if the data can repeatedly be written in each data storage area up to 10,000 times, for example, the data can repeatedly be written in the entire $E^2$PROM 2 up to 10,000n times because they are written successively in the data storage areas 2-1~2n. As a result, the limitation on the number of times that data can repeatedly be written in the $E^2$PROM 2 is relatively high. The data storage system can thus be incorporated in electronic devices which demand highly frequent repetitive writing of data.

Figure 3:
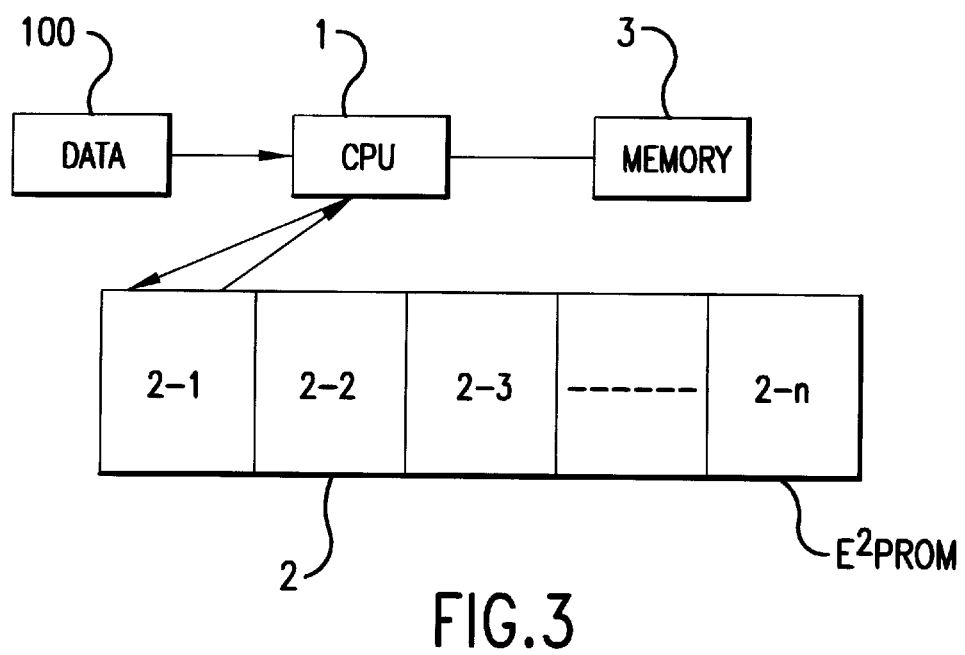
FIG. 3 is a block diagram of a data storage system according to another embodiment of the present invention.

FIG. 3 shows a data storage system according to another embodiment of the present invention. The data storage system shown in FIG. 3 comprises a CPU 1, a data storage device 2 in the form of an electrically erasable programmable read-only memory ($E^2$PROM) which is controllable by the CPU 1 to store and read data, and a nonvolatile memory 3 for storing data storage area information. The $E^2$PROM 2 has an array of n divided data storage areas 2-1~2-n each composed of at least a data storage location indicated by an address.

The data storage system shown in FIG. 3 operates as follows: After the data storage system starts operating by being switched on, the CPU 1 writes supplied data in the $E^2$PROM 2 according to a sequence shown in FIG. 4. The CPU 1 writes supplied data 100 in the data storage area 2-1 of the $E^2$PROM 2 in a step 401, and then reads a fragment of the data written in the data storage area 2-1 in a step 402. The CPU 1 compares, in a next step 403, the read data fragment with the supplied data 100, not written in the data storage area 2-1, to determine whether the compared data are the same as each other. If the compared data are the same as each other, then the CPU 1 decides that the data has been written properly in the data storage area 2-1, and control goes back to the step 401 for repetitive writing of data. If the compared data are not the same as each other, then the CPU 1 decides that the data has not been written properly in the data storage area 2-1, i.e., the data storage area 2-1 is no longer usable, and control goes to a step 404 in which the CPU 1 writes area fault information indicating that the data storage area 2-1 has a fault and is not usable in the memory 3. The step 404 is followed by a step 405 in which the CPU 1 writes the data 100 in the data storage area 2-2 of the $E^2$PROM 2. Thereafter, the CPU 1 reads a fragment of the data written in the data storage area 2-2 in a step 406, and compares the read data fragment with the data 100, not written in the data storage area 2-2, to determine whether the compared data are the same as each other in a step 407. If the compared data are the same as each other, then the CPU 1 decides that the data has been written properly in the data storage area 2-2, and control goes back to the step 405 for repetitive writing of data. If the compared data are not the same as each other, then the CPU 1 decides that the data has not been written properly in the data storage area 2-2, i.e., the data storage area 2-2 is no longer usable, and control goes to a step 408. In the step 408, the CPU 1 writes area fault information indicating that the data storage area 2-2 has a fault and is not usable in the memory 3.

As described above with respect to the steps 403, 404, and 405, if a certain data storage area has a fault and cannot store the supplied data, then the CPU 1 addresses the next data storage area to store the data. If the data storage area 2-(n−1) of the $E^2$PROM 2 has a fault and cannot store the supplied data, then control goes to a step 409 in which the CPU 1 writes the data 100 in the data storage area 2-n of the $E^2$PROM 2. Thereafter, the CPU 1 reads a fragment of the data written in the data storage area 2-n in a step 410, and compares the read data fragment with the data 100, not written in the data storage area 2-n, to determine whether the compared data are the same as each other in a step 411. If the compared data are the same as each other, then the CPU 1 decides that the data has been written properly in the data storage area 2-n, and control goes back to the step 409 for repetitive writing of data. If the compared data are not the same as each other, then the CPU 1 decides that the data has not been written properly in the data storage area 2-n, i.e., the data storage area 2-n is no longer usable, and control goes to a step 412. In the step 412, the CPU 1 writes area fault information indicating that the data storage area 2-n has a fault and is not usable in the memory 3. Control proceeds from the step 412 to a step 413 in which the CPU 1 decides that the $E^2$PROM 2 is unusable and stops the writing of data into the $E^2$PROM 2. The data writing sequence now comes to an end.

Figure 4:
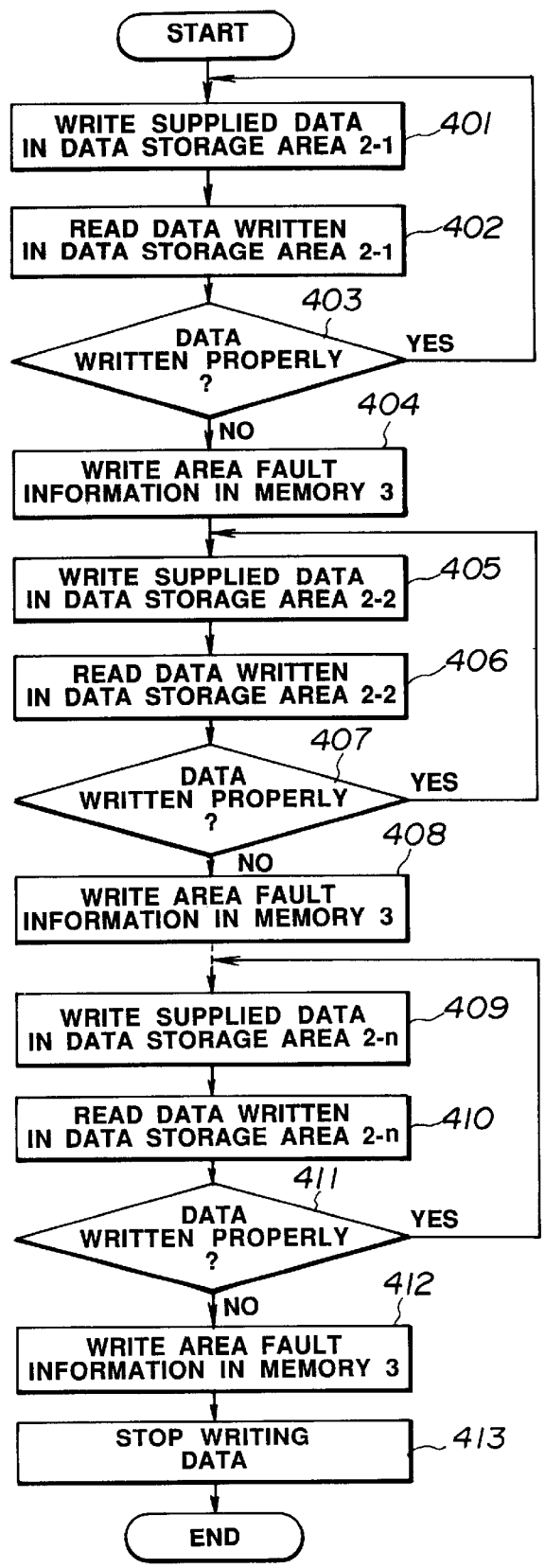
FIG. 4 is a flowchart of a process of writing data in a data storage device of the data storage system shown in FIG. 3.

When the data storage system is switched on again for writing data, the CPU 1 determines a data storage area or areas to write data therein based on any area fault information that has been stored in the memory 3, and then executes the data writing sequence shown in FIG. 4.

With the data storage system shown in FIG. 4, the CPU 1 writes data repeatedly in the data storage area 2-1 as long as it is usable. When the data storage area 2-1 has a fault and becomes unusable, the CPU 1 starts writing data in the next data storage area 2-2. When the data storage area 2-2 becomes unusable, the CPU 1 starts writing data in the next data storage area 2-3. The CPU 1 repeats such a process until the data storage area 2-n is reached. Therefore, even if the data can repeatedly be written in each data storage area up to 10,000 times, for example, the data can repeatedly be written in the entire $E^2$PROM 2 up to 10,000n times because they are written in the data storage areas 2-1~2-n. As a consequence, the limitation on the number of times that data can repeatedly be written in the $E^2$PROM 2 is relatively high. The data storage system can thus be incorporated in electronic devices which demand highly frequent repetitive writing of data. The data storage system shown in FIG. 4 allows more effective utilization of the $E^2$PROM 2 because its writing process is interrupted when all the data storage areas 2-1~2-n, not just one, become unusable.

Figure 5:
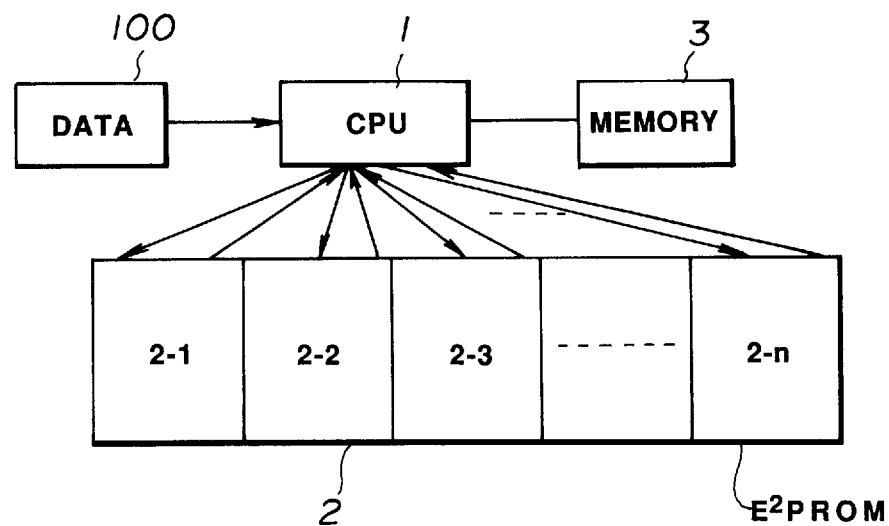
FIG. 5 is a block diagram of a data storage system according to still another embodiment of the present invention.

FIG. 5 shows a data storage system according to still another embodiment of the present invention. The data storage system shown in FIG. 5 comprises a CPU 1, a data storage device 2 in the form of an electrically erasable programmable read-only memory ($E^2$PROM) which is controllable by the CPU 1 to store and read data, and a non-volatile memory 3 for storing data storage area information. The $E^2$PROM 2 has an array of n divided data storage areas 2-1~2-n each composed of at least a data storage location indicated by an address.

The data storage system shown in FIG. 5 operates as follows: After the data storage system is switched on, the CPU 1 starts writing supplied data in the $E^2$PROM 2 according to a sequence shown in FIG. 6. The CPU 1 writes supplied data 100 in the data storage area 2-1 of the $E^2$PROM 2 in a step 601, and then reads a fragment of the data written in the data storage area 2-1 in a step 602. In a next step 603, the CPU 1 compares the read data fragment with the supplied data 100, not written in the data storage area 2-1, to determine whether the compared data are the same as each other. If the compared data are not the same as each other, then the CPU 1 decides that the data has not been written properly in the data storage area 2-1, i.e., the data storage area 2-1 is no longer usable, and control goes to a step 604 in which the CPU 1 writes area fault information indicating that the data storage area 2-1 has a fault and is not usable in the memory 3. Thereafter, control goes from the step 604 to a step 605. In the step 605 following the step 604, the CPU 1 writes the data 100 in the data storage area 2-2 of the $E^2$PROM 2. If the compared data are the same as each other in the step 603, then the CPU 1 decides that the data has been written properly in the data storage area 2-1, and control goes to the step 605. In the step 605, the CPU 1 writes next supplied data 100 in the data storage area 2-2 of the $E^2$PROM 2. The step 605 is followed by a step 606 in which the CPU 1 reads a fragment of the data written in the data storage area 2-2. Then, the CPU 1 compares the read data fragment with the supplied data 100, not written in the data storage area 2-2, to determine whether the compared data are the same as each other in a step 607. If the compared data are not the same as each other, then the CPU 1 decides that the data has not been written properly in the data storage area 2-2, i.e., the data storage area 2-2 is no longer usable, and control goes to a step 608 in which the CPU 1 writes area fault information indicating that the data storage area 2-2 has a fault and is not usable in the memory 3. Then, control goes from the step 608 to a next step, which also follows the step 607 if the compared data are the same as each other and hence the CPU 1 decides that the data has been written properly in the data storage area 2-2.

Thereafter, the CPU 1 writes data successively in the other data storage areas 2-3~2-(n–1) in the same manner as described above. Then, control proceeds to a step 609 in which the CPU 1 writes next supplied data 100 in the data storage area 2-n of the E²PROM 2. After the step 609, the CPU 1 reads a fragment of the data written in the data storage area 2-n in a step 610. Then, the CPU 1 compares the read data fragment with the supplied data 100, not written in the data storage area 2-n, to determine whether the compared data are the same as each other in a step 611. If the compared data are not the same as each other, then the CPU 1 decides that the data has not been written properly in the data storage area 2-n, and control goes to a step 612. If the compared data are the same as each other, then the CPU 1 decides that the data has been written properly in the data storage area 2-n, and control goes back to the step 601 for repetitive writing of data. In the step 612, the CPU 1 writes area fault information indicating that the data storage area 2-n has a fault and is not usable in the memory 3. The CPU 1 then determines whether all the data storage areas 2-1~2-n are unusable in a step 614. If all the data storage areas 2-1~2-n are unusable, then CPU 1 stops the writing of data in the E²PROM 2 in a step 613.

If the data has been written properly in the data storage area 2-n in the step 611, as described above, then the CPU 1 refers to the memory 3, and control goes back to the step 601 in the absence of any area fault information in the memory 3. If the memory 3 stores area fault information indicating that the data storage area 2-1 is unusable, then control returns from the step 611 to the step 605, rather than the step 601. The CPU 1 writes supplied data 100 in the data storage areas of the E²PROM 2, skipping those indicated by any area fault information stored in the memory 3, and stops writing supplied data 100 in the E²PROM 2 at the time all the data storage areas become unusable. When the data storage system is switched on again, the CPU 1 checks the memory 3 for any stored information, and writes data in only the usable data storage areas of the E²PROM 2.

Figure 6:
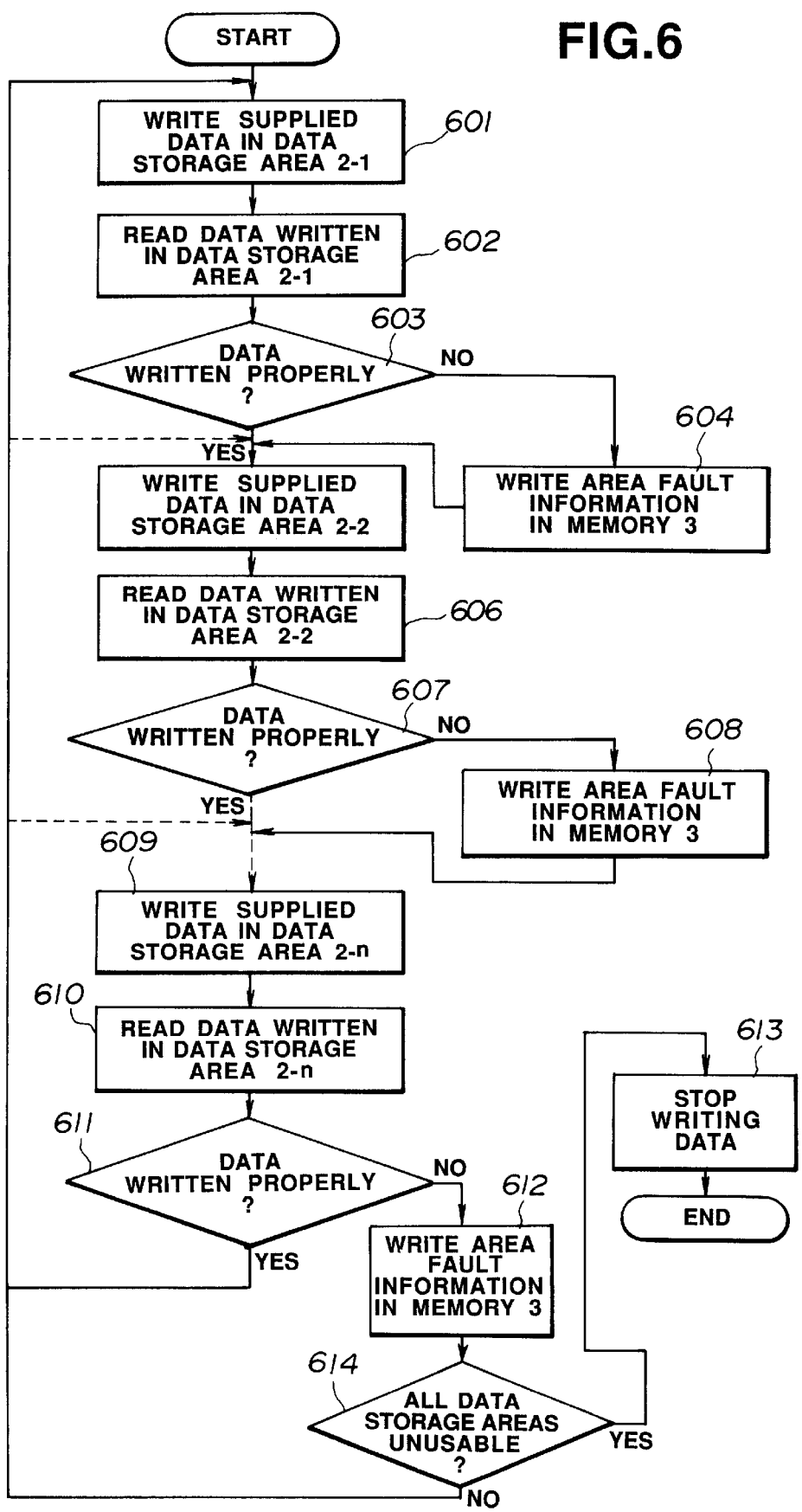
FIG. 6 is a flowchart of a process of writing data in a data storage device of the data storage system shown in FIG. 5.

In the embodiment shown in FIG. 6, the successively supplied data are written successively in the data storage areas 2-1~2-n of the E²PROM 2, and hence the data is written in each data storage area 1/n times upon data storage in the data storage areas 2-1~2-n in a single writing sequence. Therefore, even if the data can repeatedly be written in each data storage area up to 10,000 times, for example, the data can repeatedly be written in the entire E²PROM 2 up to 10,000n times because they are written successively in the data storage areas 2-1~2-n. Accordingly, the limitation on the number of times that data can repeatedly be written in the E²PROM 2 is relatively high. The data storage system can thus be incorporated in electronic devices which demand highly frequent repetitive writing of data. Furthermore, in the event that a certain data storage area is unusable, the CPU 1 writes data successively in the remaining data storage areas of the E²PROM 2, skipping the unusable data storage area. The data storage system shown in FIG. 5 can utilize the data storage areas of the E²PROM 2 more effectively than the data storage system shown in FIG. 1.

Each of the data storage systems according to the above embodiments of the present invention may be incorporated in a analog, digital, dual-mode, or multiple-mode radio communication system such as a portable radio telephone system, a mobile radio telephone system, a cordless radio telephone system, or the like.

One dual-mode mobile radio communication system to which the principles of the present invention are applicable will be described below with reference to FIGS. 7 through 9. The dual-mode mobile radio communication system is operable in either an analog mode or a digital mode.

Figure 7:
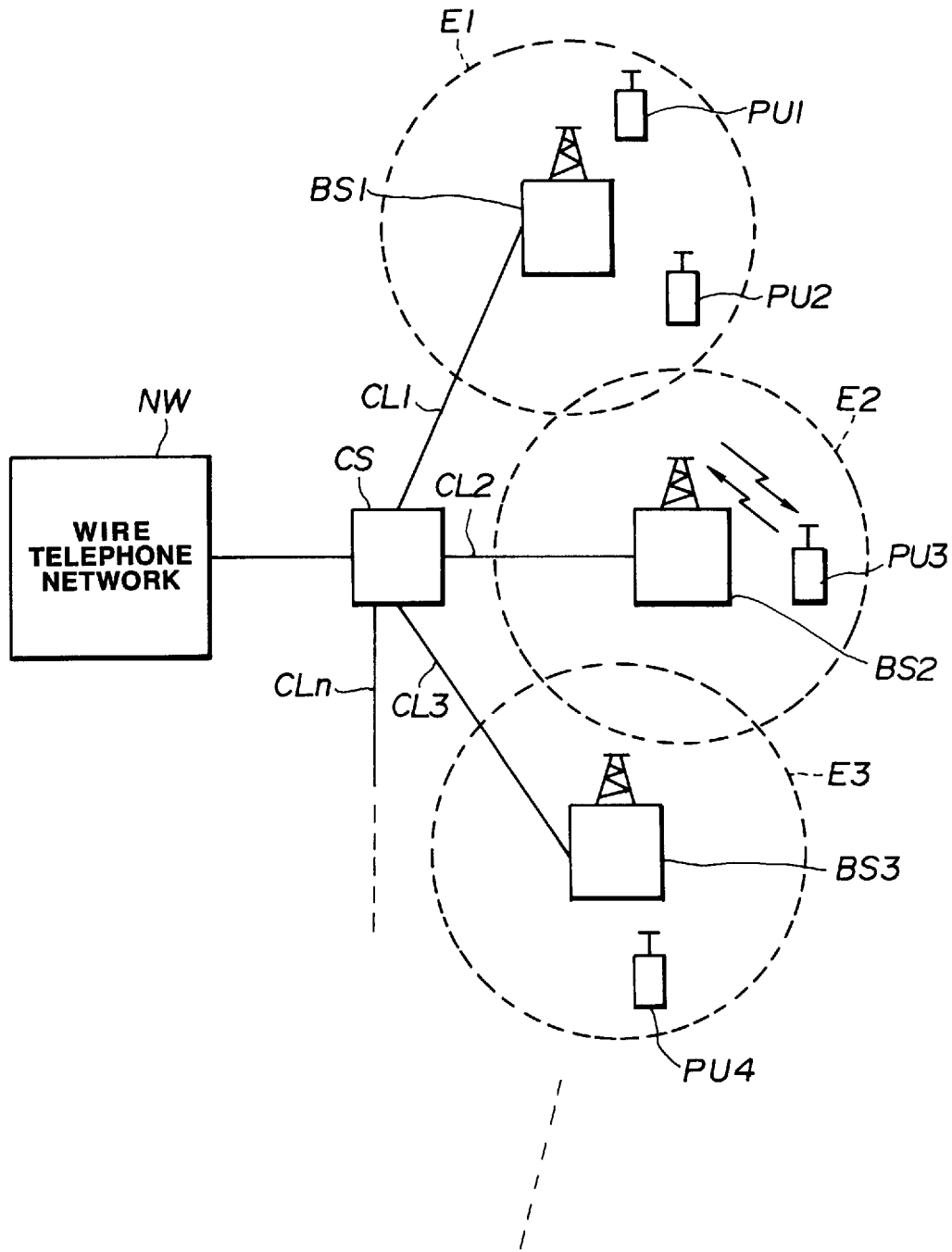
FIG. 7 is a block diagram of a dual-mode mobile radio communication system which incorporates a data storage system according to the present invention.

In FIG. 7, the dual-mode mobile radio communication system is shown as a cellular mobile radio telephone network system. The dual-mode mobile radio communication system comprises a control station CS connected to a wire telephone network NW, a plurality of base stations BS1, BS2, BS3 connected to the control station CS through landlines CL1, CL2, CL3, respectively, and a plurality of mobile radio units PU1, PU2, PU3, PU4. The service area of the dual-mode mobile radio communication system is divided into a plurality of mobile service areas or radio zones E1, E2, E3 assigned to the respective base stations BS1, BS2, BS3. The mobile radio units PU1, PU2, PU3, PU4 can communicate with the base stations BS1, BS2, BS3 via radio links in the radio zones E1, E2, E3.

The dual-mode mobile radio communication system shown in FIG. 7 operates as follows: First, a control channel is established for exchanging control signals between the control station CS and one of the mobile radio units. Then, a speech channel operating in either the analog mode or the digital mode depending on a mode designation signal among the control signals is established between the control station CS and the mobile radio unit.

In the analog mode, a modulator angle-modulates a carrier signal with a speech signal and data. A transmitter then transmits the angle-modulated carrier signal. A receiver receives the angle-modulated carrier signal, and a demodulator angle-demodulates the carrier signal to reproduce the speech signal and the data. In the analog mode, the dual-mode mobile radio communication system may include an analog audio circuit which performs signal processing such as compression of a speech signal to be transmitted and expansion of a speech signal that has been received, and also limits the frequency band of a speech signal.

In the digital mode, an encoder encodes a speech signal and data. A modulator modulates a carrier signal with the encoded speech signal and data. A transmitter then transmits the modulated carrier signal. A receiver receives the modulated carrier signal, and a demodulator demodulates the carrier signal into a baseband signal. A decoder then decodes the baseband signal to reproduce the speech signal and the data. In the digital mode, the digital speech signals are transmitted between the base stations and the mobile radio units according to the TDMA (Time-Division Multiple Access) transmission process. In the digital mode, the dual-mode mobile radio communication system may include a digital modem, a speech encoder/decoder (hereinafter referred to as "speech codec") for encoding and decoding speech signals, and a channel encoder/decoder (hereinafter referred to as "channel codec") for correcting errors of speech signals and interleaving and deinterleaving speech signals for TDMA transmission.

In addition, the dual-mode mobile radio communication system may include an echo canceller operable in both the analog mode and the digital mode. The echo canceller is used to cancel acoustic echoes caused between a loudspeaker and a microphone during hands-free operation of the system.

FIG. 8 illustrates, by way of example, one of the mobile radio units PU1~PU4 which is typically assembled as a mobile radio telephone set. As shown in FIG. 8, the mobile radio telephone set has an antenna 10 and a duplexer 12 connected to the antenna 10. The duplexer 12 is also connected to a receiver 13 and a transmitter 18. A digital demodulator 15 for use in the digital mode is coupled to the receiver 13 through an analog-to-digital converter (hereinafter referred to as A/D converter) 16. A digital modulator 26 for use in the digital mode is coupled to the transmitter 28 through a digital-to-analog converter (hereinafter referred to as D/A converter) 27. A synthesizer 14 supplies signals of predetermined frequencies to the receiver 13 and the transmitter 28. An analog audio circuit 30 for use in the analog mode is additionally coupled to the receiver 13 and the transmitter 28.

A channel codec 18 is connected to the digital demodulator 15 and the digital modulator 26, and a speech codec 19 is connected to the channel codec 18. The speech codec 19 is connected to an echo canceler 20 through an analog switch 51, which is coupled to the analog audio circuit 30 through an A/D converter 53. The speech codec 19 is also connected to the echo canceler 20 through another analog switch 52, which is coupled to the analog audio circuit 30 through a D/A converter 54. A D/A converter 21 is connected between the echo canceler 20 and a loudspeaker 22. An A/D converter 24 is connected between a microphone 23 and the echo canceler 20. A controller 42 is connected to the A/D converter 53, the D/A converter 54, the analog switches 51, 52, the channel codec 18, the speech codec 19, the receiver 13, the synthesizer 14, and the transmitter 28. A control unit 50 having a hook switch, a keypad, and a display unit is connected to the controller 42. A power supply 60 supplies a voltage Vcc to the circuit elements from, for example, a battery.

The analog switches 51, 52 switch over in response to the logic level of a switching control signal S2 supplied from the controller 42. In the digital mode, the analog switches 51, 52 are controlled by the switching control signal S2 to connect the speech codec 19 to the echo canceler 20. In the analog mode, the analog switches 51, 52 are controlled by the switching control signal S2 to connect the A/D converter 53 and the D/A converter 54 to the echo canceler 20. The A/D converter 53 and the D/A converter 54 are controlled by a control signal S1 supplied from the controller 42.

Figure 9:
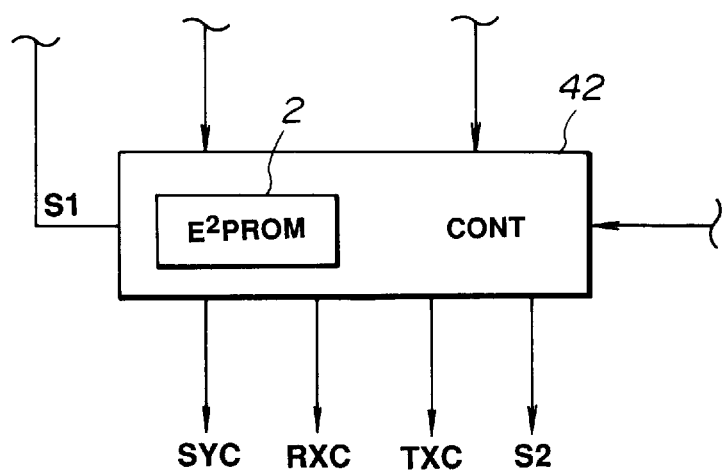
FIG. 9 is a block diagram of a controller in the mobile radio telephone set shown in FIG. 8.

The controller 42 may comprise a microcomputer including an $E^2PROM$ 2 according to the present invention as shown in FIG. 9. In addition to controlling radio link establishment operations, the controller 42 controls switching operation of the analog switches 51, 52, converting operation of the A/D and D/A converters 53, 54, operation of the channel codec 18 and the speech codec 19, and operation of the receiver 13, the synthesizer 14, and the transmitter 28. The channel codec 18 and the speech codec 19 are rendered operative in the digital mode and inoperative in the analog mode.

Operation of the mobile radio telephone set will be described below. The mode, either the analog mode or the digital mode, of the mobile radio telephone set is determined by a mode designation signal among the control signals which are transmitted from a base station and which also designate a speech channel. When the mobile radio telephone set receives a digital mode designation signal over the control channel, a speech radio link is established for transmission of digital speech signals. Responsive to the establishment of the speech radio link, the controller 42 generates the switching control signal S2 indicative of the digital mode. When supplied with the switching control signal S2 from the controller 42, the analog switches 51, 52 are actuated to connect the speech codec 19 to the echo canceler 20. The controller 42 also supplies control signals to energize the channel codec 18 and the speech codec 19.

When the receiver 13 receives a speech signal transmitted from the base station via the antenna 10 and the duplexer 12, the speech signal is converted into a digital speech signal by the A/D converter 16, and the digital speech signal is demodulated into a digital baseband signal by the digital demodulator 15. The channel codec 18 then deinterleaves the digital baseband signal and effects error correction on the deinterleaved signal. The channel codec 18 applies its output signal to the speech codec 19, which decodes the signal into a decoded digital speech signal. The digital speech signal outputted from the speech codec 19 passes through the echo canceler 20 to the D/A converter 21, which converts the digital speech signal into an analog speech signal that is radiated as an acoustic wave from the loudspeaker 22.

When an acoustic wave is applied to the microphone 23, the microphone 23 generates an analog speech signal that is converted into a digital speech signal by the A/D converter 24. The digital speech signal is supplied to the echo canceler 20, which cancels echo signals that have been caused by acoustic waves applied from the loudspeaker 22 to the microphone 23. The echo-free digital speech signal is thereafter encoded by the speech codec 19, and the encoded digital speech signal is supplied to the channel codec 18. The channel codec 18 adds an error correcting code to the encoded digital speech signal, and interleaves the resultant digital speech signal. The interleaved digital speech signal is then modulated by the digital modulator 26, and the modulated digital speech signal is converted into an analog speech signal by the D/A converter 27. The transmitter 28 converts the analog speech signal into a radio-frequency signal whose frequency ranges from 800 MHz to 900 MHz, and power-amplifies the radio-frequency signal. The power-amplified radio-frequency signal is applied through the duplexer 12 to the antenna 10, from which it is transmitted to the base station.

When the mobile radio telephone set receives an analog mode designation signal over the control channel, a speech radio link is established for transmission of analog speech signals. Responsive to the establishment of the speech radio link, the controller 42 generates the switching control signal S2 indicative of the analog mode. When supplied with the switching control signal S2 from the controller 42, the analog switches 51, 52 are actuated to connect the A/D and D/A converters 53, 54 to the echo canceler 20. The controller 42 also supplies control signals to deenergize the channel codec 18 and the speech codec 19 as they are not required to operate in the analog mode.

When the receiver 13 receives a speech signal transmitted from the base station via the antenna 10 and the duplexer 12, the receiver 13 demodulates the speech signal. The analog audio circuit 30 band-limits and expands the demodulated speech signal, which is then converted into a digital speech signal by the A/D converter 53. The digital speech signal is supplied through the analog switch 51 and the echo canceler 20 to the D/A converter 21. The D/A converter 21 converts the digital speech signal into an analog speech signal that is radiated as an acoustic wave from the loudspeaker 22.

When an acoustic wave is applied to the microphone 23, the microphone 23 generates an analog speech signal that is converted into a digital speech signal by the A/D converter 24. The digital speech signal is supplied to the echo canceler 20, which cancels echo signals that have been caused by acoustic waves applied from the loudspeaker 22 to the microphone 23. The echo-free digital speech signal is thereafter supplied through the analog switch 52 to the D/A converter 54, which converts the digital speech signal into an analog speech signal. The analog speech signal is then band-limited and compressed by the analog audio circuit 30. The analog speech signal outputted from the analog audio circuit 30 is modulated by the transmitter 28. The modulated speech signal is supplied through the duplexer 2 to the antenna 1, which transmits the speech signal to the base station.

The $E^2$PROM 2 in the controller 42 may be used partly or wholly as a NAM (Number Assignment Module) area for storing various kinds of information including SID (System IDentification) of mobile service areas and MIN (Mobile Identification Number) to identify the mobile radio unit in the mobile radio communication system.

Although certain preferred embodiments of the present invention have been shown and described in detail, it should be understood that various changes and modifications may be made therein without departing from the scope of the appended claims.

Thus, for example, though in the above embodiments, a definition of the data storage areas was given to the entire data storage locations, it is to be recognized that the definition may be given to any part of the data storage locations. Further, at least one range which is larger in area than a predetermined data storage area before defining areas, and then areas may be defined for each of desired ranges according to the requirements decided by data to be stored in the range, for example, the average length, the kind, the writing and/or reading frequencies, etc. of the data.

What is claimed is:

1. A data storage system permitting an increased number of writes, said system comprising:

a data storage device having predetermined areas of data storage locations and performing write, verify, and read operations on said predetermined areas, each of said predetermined areas storing data supplied with a write command, said write command being one of a plurality of write commands issued at different times during the life time of said data storage device;

first means for controlling said data storage device to write data supplied for the first time into a first one of said predetermined areas;

second means, responsive to a determination based on a verify operation that the most recently (or last) supplied data supplied with a last write command was successfully written, for controlling said data storage device to write a next supplied data supplied with a next write command into a next one of the areas of said predetermined areas which experienced a smaller number of write operations than the other areas of said predetermined areas, said second means further comprising:

means for controlling said data storage device to write said next supplied data into said first one of said predetermined areas in response to a further determination that each of said predetermined areas has experienced an identical number of write operations; and means responsive to a determination based on verify operation that said last supplied data was not successfully written for prohibiting said data storage device from writing.

2. The data storage system according to claim 1 further comprising:

means for defining at least one operation range in the space comprising all of said data storage locations; and means for defining a plurality of user defined areas in each of said at least one operation range, wherein:

operation of said first and second means is directed to the user defined areas in a specified operation range.

3. A data storage system permitting an increased number of writes, said system comprising:

a data storage device having predetermined areas of data storage locations and performing write, verify, and read operations on said predetermined areas, each of said predetermined areas storing data supplied with a write command, said write command being one of a plurality of write commands issued at different times during the life time of said data storage device;

first means for controlling said data storage device to write data supplied for the first time into a first one of said predetermined areas;

second means, responsive to a first determination based on a verify operation that the last supplied data supplied with the last write command was successfully written, for controlling said data storage device to write a next supplied data supplied with a next write command into a following one of a usable area of said predetermined areas which experienced a smaller number of write operations than the other usable areas of said predetermined areas; and third means, responsive to a second determination based on said verify operation that said last supplied data was not successfully written for controlling said storage device to write said last supplied data into a following one of the usable areas of said predetermined areas which experienced a smaller number of write operations than other usable predetermined areas, wherein:

said second and third means are responsive to a further determination that each of said usable predetermined areas have experienced an identical number of write operations for controlling said device to write said next supplied data into said first one of said usable predetermined areas.

4. The data storage system according to claim 3 wherein:

said third means includes means, responsive to a determination that all of said predetermined areas have become unusable, for prohibiting said data storage device from writing.

5. The data storage system according to claim 3, further comprising:

means for defining at least one operation range in the space comprising all of said storage areas locations; and means for defining a plurality of user defined areas in each of said at least one operation range, wherein:

operation of said first, second, and third means is directed to the user defined areas in a specified operation range.

6. The data storage system according to claim 3 wherein said third means includes means for storing information on the area where said last supplied data was not successfully written; and said second and third means utilize said information for said controlling.

7. The data storage system according to any of claims 1, and 3 further comprising:

means for setting a part of said each data storage area for a target of said verify operation.

8. A method of increasing the number of possible write operations in a system including a data storage device having predetermined areas of data storage locations and performing write, verify, and read operations on said predetermined areas, each of said predetermined areas storing data supplied with a write command, said write command being one of write commands issued during the life time of said data storage device, said method comprising the steps of:

(a) writing data supplied for the first time into a first one of said predetermined areas; and (b) in response to a determination based on a verify operation that the last supplied data supplied with a last write command was successfully written, writing a next supplied data supplied with a next write command in a next one of the areas of said predetermined areas which experienced a smaller number of write operations than the other areas of said predetermined areas wherein:

step (b) includes the step of:

in response to a further determination that each of said predetermined areas has experienced an identical number of write operations, writing said next supplied data into said first one of said predetermined areas; and said method further includes the step of:

in response to a determination based on said verify operation that said last supplied data was not successfully written, performing no more write operations.

9. A method of increasing the number of possible write operations in a system including a data storage device having predetermined areas of data storage locations and performing write, verify, and read operations on said predetermined areas, each of said predetermined areas storing data supplied with a write command, said write command being one of write commands issued during the life time of said data storage device, said method comprising the steps of:

(a) writing data supplied for the first time into a first one of said predetermined areas; and (b) in response to a determination based on a verify operation that the last supplied data supplied with a last write command was successfully written, writing a next supplied data supplied with a next write command into a following one of a usable area of said predetermined areas which experienced a smaller number of write operations than the other usable predetermined areas (c) in response to a determination based on said verify operation that said last supplied data was not successfully written, writing said last supplied data into a following one of the usable areas of said predetermined areas which experienced a smaller number of write operations than other usable predetermined areas, wherein steps (b) and (c) include the step of:

(d) in response to a determination that each of said usable predetermined areas have experienced an identical number of write operations, writing said next supplied data into said first one of said usable predetermined areas.

10. The method according to claim 9 further comprising the step of:

(e) in response to a determination based on said verify operation that all of said predetermined areas have become unusable, performing no more write operations.

11. The method according to claim 10 wherein step (c) includes the step of:

storing up information on the unusable area where said last supplied data was not successfully written and steps (b), (c) and (e) include the step of:

in said writing, utilizing said information for a determination of whether said predetermined area associated with said writing is usable or not.

12. A radio communication apparatus for use in a radio communication system wherein signals are transmitted from a communication station to said apparatus over radio links, said apparatus comprising:

receiving means for receiving a plurality of signals carrying respective data and separately transmitted at different times from said communication station over said radio links;

storing means having a plurality of areas of data storage locations permitting write, verify, and read operations, said each area storing data transmitted by one of said plurality of signals received by said receiving means;

first means for controlling said storing means to write data received for the first time by said apparatus into a first one of said plurality of areas; and second means, responsive to a determination based on said verify operation that the last supplied data supplied by the last signal was successfully written, for controlling said storing means to write a next supplied data supplied by a next signal into a next one of the storage areas which experienced a smaller number of write operations than other of said areas, and said second means responsive to a further determination that each of said plurality of storage areas has experienced an identical number of write operations for controlling said storing means to write said next supplied data into said first one of said plurality of areas, said second means including:

means, responsive to a determination based on said verify operation that said supplied data was not successfully written, for instructing said storing means to perform no more write operations.

13. A radio communication apparatus for use in a radio communication system wherein signals are transmitted from a communication station to said apparatus over radio links, said apparatus comprising:

receiving means for receiving a plurality of signals carrying respective data and separately transmitted at different times from said communication station over said radio links;

storing means having a plurality of areas of data storage locations permitting write, verify, and read operations, said each area storing data transmitted by one of said plurality of signals received by said receiving means;

first means for controlling said storing means to write data received for the first time by said apparatus into a first one of said plurality of areas; and second means, responsive to a determination based on said verify operation that the last supplied data supplied by the last signal was successfully written, for controlling said storing means to write a next supplied data supplied by a next signal into a following one of the usable areas of said storage areas which experienced a smaller number of write operations than the other usable areas, and said second means responsive to a determination based on said verify operation that said last supplied data was not successfully written, for controlling said storing means to write said last supplied data into a following one of the usable areas among said storage areas which experienced a fewer number of write operations than the other usable areas, said second means including:

means, responsive to a further determination that each usable area of said plurality of areas have experienced an identical number of write operations for controlling said storing means to write said next supplied data into said first one of said usable areas.

14. A radio communication apparatus for use in a radio communication system wherein said apparatus communicates with a communication station over radio links, said apparatus comprising:

a data source for providing a plurality of data transmissions at such time intervals that data provided by said data transmissions are written by different write operations;

storing means having a plurality of areas of data storage locations permitting write, verify, and read operations, said each area storing data supplied by one of said data transmissions provided by said data source;

first means for controlling said storing means to write data supplied by a first data transmission to said storing means into a first one of said plurality of areas; and second means, responsive to a determination based on a verify operation that the last data supplied by a last data transmission was successfully written, for controlling said storing means to write a next supplied data supplied by a next data transmission into a next one of said storage areas which experienced a smaller number of write operations than the other usable areas of said storage areas, and said second means responsive to a further determination that each of said plurality of storage areas has experienced an identical number of write operations, for controlling said storing means to write said next supplied data into said first one of said plurality of areas, said second means including:

means, responsive to a determination based on said verify operation that said last supplied data was not successfully written, for instructing said storing means to perform no more write operations.

15. A radio communication apparatus for use in a radio communication system wherein said apparatus communicates with a communication station over radio links, said apparatus comprising:

a data source for providing a plurality of data supplies at such time intervals that data provided by said data supplies are written by different write operations;

storing means having a plurality of areas of data storage locations permitting write, verify, and read operations, said each area storing data supplied by one of said data supplies provided by said data source;

first means for controlling said storing means to write data supplied by the first data supply to said storing means into a first one of said plurality of areas; and second means responsive to a determination based on verify operation that the last supplied data supplied by the last data supply was successfully written for controlling said storing means to write the next supplied data supplied by the next data supply into a following one of the usable storage areas which experienced a smaller number of write operations than the other usable areas, and responsive to a determination based on said verify operation that said last supplied data was not successfully written for controlling said storing means to write said last supplied data into a following one of the usable storage areas which experienced a fewer number of write operations than the other usable areas, said second means including:

means responsive to a further determination that each of all the usable areas of said plurality of storage areas have experienced an identical number of write operations for controlling said storing means to write said next supplied data into said first one of said usable areas.

* * * * *